(12) United States Patent
Tan (10) Patent No.: US 7,426,118 B2
(45) Date of Patent: Sep. 16, 2008

(54) PRINTED WIRING BOARD

(75) Inventor: Kunihiro Tan, Tokyo (JP)

(73) Assignee: Ricoh Company, Ltd, Tokyo (JP)

( * ) Notice: Subject to any disclaimer, the term of this patent is extended or adjusted under 35 U.S.C. 154(b) by 93 days.

(21) Appl. No.: 11/127,755

(22) Filed: May 11, 2005

(65) Prior Publication Data
US 2006/0289199 A1    Dec. 28, 2006

(51) Int. Cl.
*H05K 9/00* (2006.01)
(52) U.S. Cl. .................... 361/777; 361/772; 361/774; 361/803; 361/816; 361/818; 174/261; 174/250; 333/12
(58) Field of Classification Search ................ 361/777, 361/799, 800, 816, 818, 753, 803, 772, 778, 361/776, 774, 748, 760; 333/12; 174/250, 174/255, 251, 261, 376
See application file for complete search history.

(56) References Cited

U.S. PATENT DOCUMENTS

| | | | |
|---|---|---|---|
| 4,954,929 A * | 9/1990 | Baran ........................ 361/794 |
| 5,039,824 A * | 8/1991 | Takashima et al. ............ 174/33 |
| 5,389,735 A * | 2/1995 | Bockelman .................. 174/33 |
| 5,397,862 A * | 3/1995 | Bockelman et al. ......... 174/250 |
| 5,430,247 A * | 7/1995 | Bockelman .................. 174/33 |
| 6,396,000 B1 * | 5/2002 | Baum ........................ 174/261 |
| 6,621,385 B1 * | 9/2003 | Jain ........................... 333/247 |
| 7,167,378 B2 * | 1/2007 | Yamada ...................... 361/777 |

* cited by examiner

*Primary Examiner*—Dean A. Reichard
*Assistant Examiner*—Dameon E. Levi
(74) *Attorney, Agent, or Firm*—Cooper & Dunham LLP (57) ABSTRACT

To cancel a magnetic field in an interconnection pattern of a printed wiring board.

A first interconnection pattern 3a is formed on a surface 1a of an insulating substrate 1. A second interconnection pattern 5a is formed on a bottom surface 1b of the insulating substrate 1 so as to be superposed on a meandering part of the first interconnection pattern 3a when viewed from the upper surface side. An end part 5b of the second interconnection pattern 5a is electrically connected to an end part 3d of the first interconnection pattern 3a via through holes 7a. The first interconnection pattern 3a and the second interconnection pattern 5a form a single interconnection line via the through holes 7a. Accordingly, the first interconnection pattern 3a and the second interconnection pattern 5a are 180° different from each other in the direction in which current flows.

12 Claims, 5 Drawing Sheets

PRINTED WIRING BOARD

TECHNICAL FIELD

The present invention relates to printed wiring boards.

BACKGROUND ART

Conventionally, there are a method of getting the original circuit performance out of a high-frequency semiconductor circuit chip by reducing inductance in interconnection lines and a method of suppressing noise emitted from a cable connected to a printed wiring board.

For instance, there is a method of getting the original performance out of a high-frequency semiconductor circuit chip by reducing mutual inductance by disposing a ground line and a signal line corresponding thereto closely so that they are side by side in positions such that the magnetic fields created by the ground line and the signal line cancel each other, considering a disposition including the signal line, in the case of mounting a high-frequency semiconductor circuit chip formed of gallium arsenide (GaAs) or the like in a package and electrically connecting it to a printed wiring board or the like by wire bonding (for instance, see Patent Document 1).

There is disclosure of a method of suppressing noise emitted from a cable by causing current flowing through the cable to have magnetic fields generated around the cable cancel each other by having the cable, connected to a printed wiring board through a connector, provided on the printed wiring board being caught in the cutouts of a conductive member so that the cable alternates between the top and the bottom thereof, the conductive member being provided on a side end part of the printed wiring board with the cutouts being formed in series at equal intervals on the conductive member (see, for instance, Patent Document 2).

[Patent Document 1] Japanese Patent No. 3483132
[Patent Document 2] Japanese Laid-Open Patent Application No. 2000-124695

However, these prior-art techniques are for canceling a magnetic field in an interconnection member connected to a printed wiring board, but do not cancel a magnetic field in the interconnection pattern of the printed wiring board.

SUMMARY

In an aspect of this disclosure, a printed wiring board is provided which is capable of canceling a magnetic field in the interconnection pattern of the printed wiring board.

in an exemplary embodiment of this disclosure, printed wiring board includes a first interconnection pattern and a second interconnection pattern 180° different from each other in the direction in which current flows, where the first interconnection pattern and the second interconnection pattern is disposed closely in positions such that magnetic fields created thereby cancel each other.

A first mode of the printed wiring board of the above-mentioned Exemplary embodiment has the first interconnection pattern and the second interconnection pattern formed on the same plane surface.

In the first mode of the above-mentioned exemplary embodiment, the first interconnection pattern and the second interconnection pattern may be formed by bending back a single interconnection line.

Further, the first interconnection pattern and the second interconnection pattern may function as resistors.

Further, the first interconnection pattern and the second interconnection pattern may be sandwiched between insulating materials so that there may be no metal plating provided on the first interconnection pattern and the second interconnection pattern.

In this specification, the insulating materials include an insulating substrate.

A second mode of the printed wiring board of the above-mentioned Exemplary embodiment has two or more interconnection pattern layers, where the first interconnection pattern and the second interconnection pattern are formed in their respective different interconnection pattern layers.

In the second mode of the above-mentioned exemplary Embodiment, the first interconnection pattern and the second interconnection pattern may be formed by bending back a single interconnection line via a through hole.

Further, the first interconnection pattern and the second interconnection pattern may function as resistors.

Further, the first interconnection pattern and the second interconnection pattern may be sandwiched between insulating materials so that there may be no metal plating provided on the first interconnection pattern and the second interconnection pattern.

Further, the first interconnection pattern and the second interconnection pattern may be formed meanderingly.

In the above-mentioned printed wiring board, a first interconnection pattern and a second interconnection pattern 180° different from each other in the direction in which current flows are provided, and the first interconnection pattern and the second interconnection pattern are disposed closely in positions such that magnetic fields created thereby cancel each other. Accordingly, it is possible to cancel magnetic fields in the first interconnection pattern and the second interconnection pattern.

In the first mode of the above-mentioned printed wiring board, the first interconnection pattern and the second interconnection pattern are formed on the same plane surface. Accordingly, it is possible to cancel magnetic fields in the first interconnection pattern and the second interconnection pattern formed in the same interconnection pattern layer.

In the first mode, the first interconnection pattern and the second interconnection pattern may be formed by bending back a single interconnection line. This makes it possible to cancel magnetic fields with efficiency since the same current flows through the first interconnection pattern and the second interconnection pattern.

Further, the first interconnection pattern and the second interconnection pattern may function as resistors. This makes it possible to form resistors without mounting resistor components on the printed wiring board.

Further, the first interconnection pattern and the second interconnection pattern may be sandwiched between insulating materials so that there may be no metal plating provided on the first interconnection pattern and the second interconnection pattern. This makes it possible to stabilize the film thickness of the first interconnection pattern and the second interconnection pattern. In particular, this makes it possible to stabilize resistance when the first interconnection pattern and the second interconnection pattern function as resistors.

In the second mode of the above-mentioned printed wiring board, two or more interconnection pattern layers are provided, and the first interconnection pattern and the second interconnection pattern are formed in their respective different interconnection pattern layers. Accordingly, it is possible to cancel magnetic fields in the first interconnection pattern and the second interconnection pattern between the different interconnection pattern layers. Further, the first interconnection pattern and the second interconnection pattern can be disposed so as to be superposed in the stacking direction of the interconnection pattern layers. Accordingly, even in the case of increasing the line width of the first interconnection pattern and the second interconnection pattern, it is possibly to cancel magnetic fields in the first interconnection pattern and the second interconnection pattern with efficiency.

In the second mode, the first interconnection pattern and the second interconnection pattern may be formed by bending back a single interconnection line via a through hole. This makes it possible to cancel magnetic fields with efficiency since the same current flows through the first interconnection pattern and the second interconnection pattern.

Further, the first interconnection pattern and the second interconnection pattern may function as resistors. This makes it possible to form resistors without mounting resistor components on the printed wiring board.

Further, the first interconnection pattern and the second interconnection pattern may be sandwiched between insulating materials so that there may be no metal plating provided on the first interconnection pattern and the second interconnection pattern. This makes it possible to stabilize the film thickness of the first interconnection pattern and the second interconnection pattern. In particular, this makes it possible to stabilize resistance when the first interconnection pattern and the second interconnection pattern function as resistors.

Further, with respect to semiconductor components, the first interconnection pattern and the second interconnection pattern may be formed meanderingly. This makes it possible to increase the resistance of the first interconnection pattern and the second interconnection pattern. Even when the first interconnection pattern and the second interconnection pattern are formed meanderingly, it is possible to cancel magnetic fields in the first interconnection pattern and the second interconnection pattern since the first interconnection pattern and the second interconnection pattern can be disposed so as to be superposed in the stacking direction of the interconnection pattern layers.

BEST MODE FOR CARRYING OUT THE INVENTION

Figure 1A:
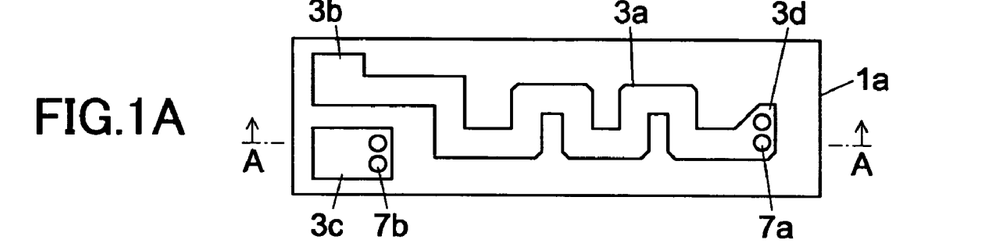
FIG. 1A is a plan view.
Figure 1B:
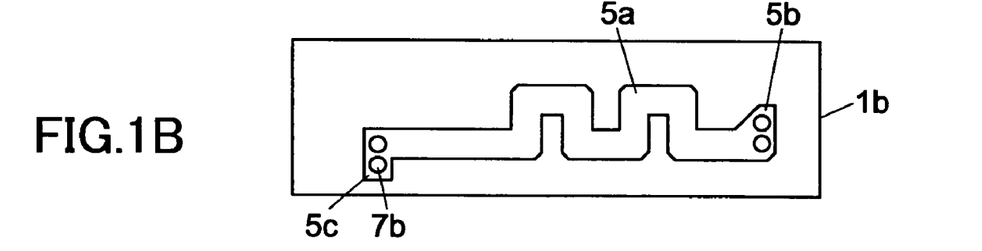
Figure 1C:
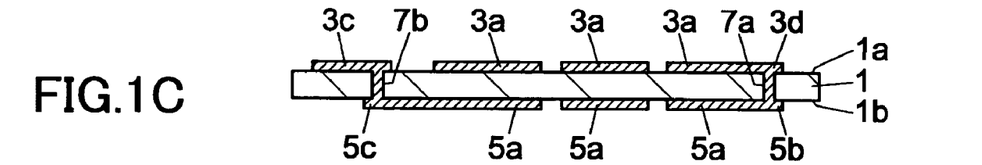

FIGS. 1A through 1C are diagrams showing an embodiment of the second mode. FIG. 1A is a plan view, FIG. 1B is a plan view showing the interconnection pattern layer of a bottom surface viewed from the upper surface side, and FIG. 1C is a cross-sectional view at the A—A position of FIG. 1A.

For instance, on a surface 1a of an insulating substrate 1 of epoxy resin of approximately 0.2 mm (millimeters) in film thickness, a first interconnection pattern 3a, an electrode 3b, and an electrode 3c of copper of approximately 0.035 mm in film thickness are formed. The first interconnection pattern 3a and the electrode 3b are formed in succession. The first interconnection pattern 3a is formed meanderingly.

For instance, a second interconnection pattern 5a and an end part 5b of copper of approximately 0.035 mm in film thickness are formed on a bottom surface 1b of the insulating substrate 1 so as to be superposed on the shape of a meandering part of the first interconnection pattern 3a and an end part 3d on the opposite side from the electrode 3b when viewed from the upper surface side. The end part 5b is electrically connected to the end part 3d of the first interconnection pattern 3a via through holes 7a. Another end part 5c of the second interconnection pattern 5a is disposed in a region corresponding to the electrode 3c on the surface 1a of the insulating substrate 1, and is electrically connected to the electrode 3c via through holes 7b. The distance between the first interconnection pattern 3a and the second interconnection pattern 5a is equivalent to the film thickness of the insulating substrate 1, which is 0.2 mm herein.

For instance, when current flows from the electrode 3b to the electrode 3c via the first interconnection pattern 3a, the through holes 7a, the second interconnection pattern 5a, and the through holes 7b, it is possible to cancel magnetic fields in the first interconnection pattern 3a and the second interconnection pattern 5a since the first interconnection pattern 3a and the second interconnection pattern 5a are 180° different from each other in the direction in which the current flows, and the first interconnection pattern 3a and the second interconnection pattern 5a are disposed closely in positions such that the magnetic fields created by both interconnection patterns 3a and 5a cancel each other.

Further, the first interconnection pattern 3a and the second interconnection pattern 5a form a single interconnection line via the through holes 7a, so that the same current flows through the first interconnection pattern 3a and the second interconnection pattern 5a. Accordingly, it is possible to cancel magnetic fields with efficiency.

Figure 2A:
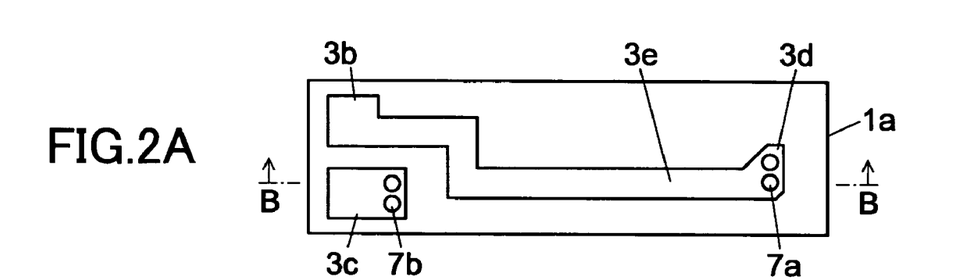
FIG. 2A is an upper surface view.
Figure 2B:
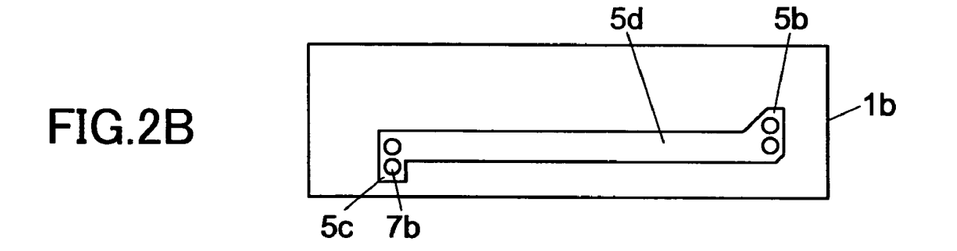
FIG. 2B is a plan view showing the interconnection pattern layer of a bottom surface viewed from the upper surface side.
Figure 2C:
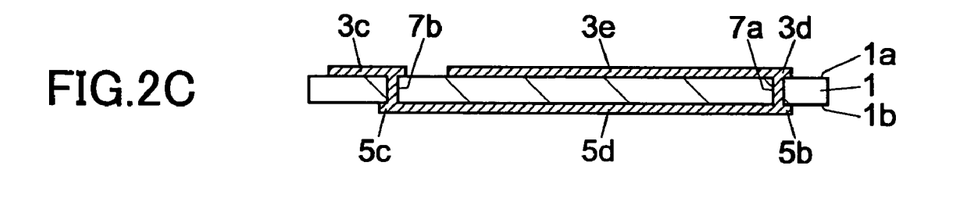
FIG. 2C is a cross-sectional view at the B—B position of FIG. 2A.

FIGS. 2A through 2C are diagrams showing another embodiment of the second mode. FIG. 2A is an upper surface view, FIG. 2B is a plan view showing the interconnection pattern layer of a bottom surface viewed from the upper surface side, and FIG. 2C is a cross-sectional view at the B—B position of FIG. 2A. The same parts as those of FIGS. 1A through 1C are assigned the same numerals, and a description thereof is omitted.

In the embodiment shown in FIGS. 1A through 1C, the first interconnection pattern 3a and the second interconnection pattern 5a are formed meanderingly. Alternatively, for instance, a first interconnection pattern 3e and a second interconnection pattern 5d may be rectilinear as in this embodiment. The first interconnection pattern 3e and the second interconnection pattern 5d are formed so that their rectilinear parts are superposed when viewed from the upper surface side.

Also in this embodiment, for instance, when current flows from the electrode 3b to the electrode 3c via the first interconnection pattern 3e, the through holes 7a, the second interconnection pattern 5d, and the through holes 7b, it is possible to cancel magnetic fields in the first interconnection pattern 3e and the second interconnection pattern 5d since the first interconnection pattern 3e and the second interconnection pattern 5d are 180° different from each other in the direction in which the current flows, and the first interconnection pattern 3e and the second interconnection pattern 5d are disposed closely in positions such that the magnetic fields created by both interconnection patterns 3e and 5d cancel each other.

Further, the first interconnection pattern 3e and the second interconnection pattern 5d form a single interconnection line via the through holes 7a, so that the same current flows through the first interconnection pattern 3e and the second interconnection pattern 5d. Accordingly, it is possible to cancel magnetic fields with efficiency.

Figure 3A:
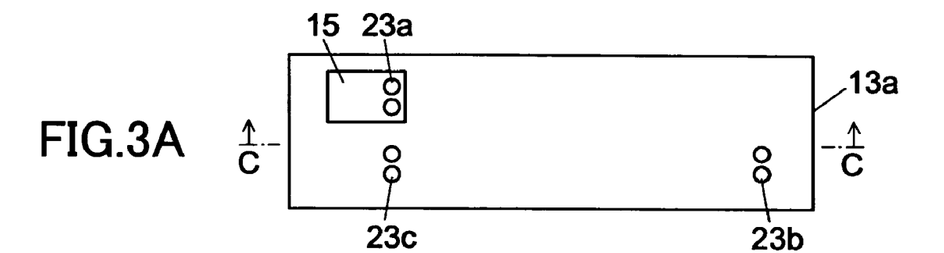
FIG. 3A is a plan view showing a first-layer interconnection pattern layer.
Figure 3B:
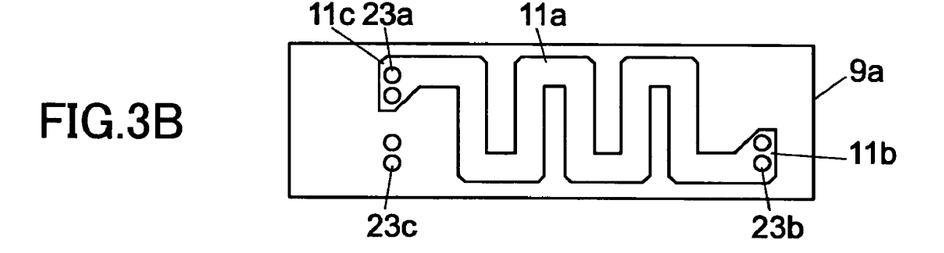
FIG. 3B is a plan view showing a second-layer interconnection pattern layer viewed from the upper surface side.
Figure 3C:
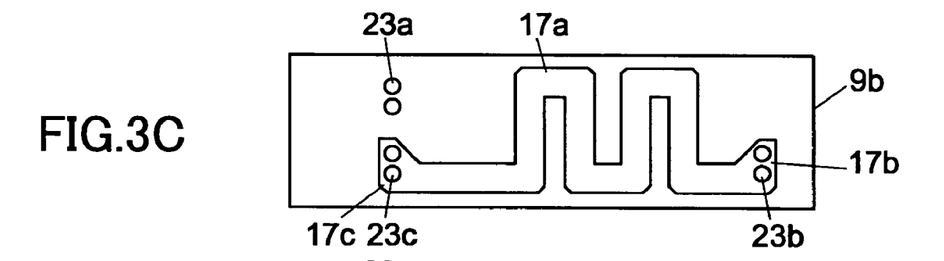
FIG. 3C is a plan view showing a third-layer interconnection pattern layer viewed from the upper surface side.
Figure 3D:
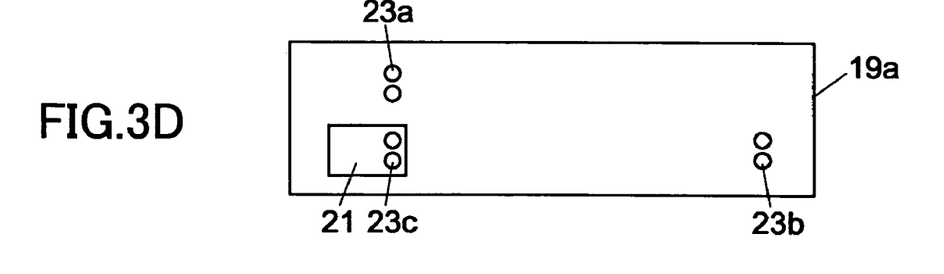
FIG. 3D is a plan view showing a fourth-layer interconnection pattern layer viewed from the upper surface side.
Figure 3E:
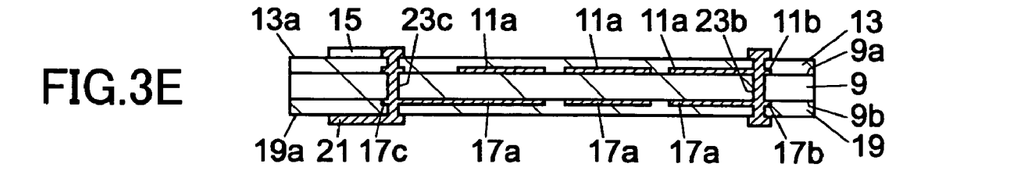
FIG. 3E is a cross-sectional view at the C—C position of FIG. 3A.

FIGS. 3A through 3E are diagrams showing yet another embodiment of the second mode. FIG. 3A is a plan view showing a first-layer interconnection pattern layer, FIG. 3B is a plan view showing a second-layer interconnection pattern layer viewed from the upper surface side, FIG. 3C is a plan view showing a third-layer interconnection pattern layer viewed from the upper surface side, FIG. 3D is a plan view showing a fourth-layer interconnection pattern layer viewed from the upper surface side, and FIG. 3E is a cross-sectional view at the C—C position of FIG. 3A.

For instance, a first interconnection pattern 11a of copper of approximately 0.018 mm in film thickness is formed on a surface 9a of an insulating substrate 9 of epoxy resin of approximately 0.2 mm in film thickness. The first interconnection pattern 11a, which is formed meanderingly, has end parts 11b and 11c.

For instance, an insulating material 13 of epoxy resin of approximately 0.1 mm in film thickness is applied on the surface 9a of the insulating substrate 9 through an adhesive agent (of which graphical representation is omitted).

For instance, an electrode 15 of copper of approximately 0.035 mm in film thickness corresponding to the end part 11c of the first interconnection pattern 11a is formed on a surface 13a of the insulating material 13.

For instance, a second interconnection pattern 17a and an end part 17b of copper of approximately 0.018 mm in film thickness are formed on a bottom surface 9b of the insulating substrate 9 so as to be superposed on the shape of a meandering part of the first interconnection pattern 11a and the end part 11b when viewed from the upper surface side. Another end part 17c of the second interconnection pattern 17a is formed in a region different from the end part 11c when viewed from the upper surface side.

For instance, an insulating material 19 of epoxy resin of approximately 0.1 mm in film thickness is applied on the bottom surface 9b of the insulating substrate 9 through an adhesive agent (of which graphical representation is omitted).

For instance, an electrode 21 of copper of approximately 0.035 mm in film thickness corresponding to the end part 17c of the second interconnection pattern 17a is formed on a surface 19a (a surface on the opposite side from the insulating substrate 9) of the insulating material 19.

The end part 11c of the first interconnection pattern 11a and the electrode 15 are electrically connected via through holes 23a. The end part 11b of the first interconnection pattern 11a and the end part 17b of the second interconnection pattern 17a are electrically connected via through holes 23b. The end part 17c of the second interconnection pattern 17a and the electrode 21 are electrically connected via through holes 23c. The through holes 23a, 23b, and 23c are formed through the insulating material 13, the insulating substrate 9, and the insulating material 19.

The through holes 23a, 23b, and 23c are formed by copper plating. The electrodes 15 and 21 are also plated with copper at the time of forming the through holes 23a, 23b, and 23c. The first interconnection pattern 11a and the second interconnection pattern 17a are covered with the insulating materials 13 and 19 at the time of copper plating. Accordingly, no plating is provided on the first interconnection pattern 11a and the second interconnection pattern 17a.

For instance, when current flows from the electrode 15 to the electrode 21 via the through holes 23a, the first interconnection pattern 11a, the through holes 23b, the second interconnection pattern 17a, and the through holes 23c, it is possible to cancel magnetic fields in the first interconnection pattern 11a and the second interconnection pattern 17a since the first interconnection pattern 11a and the second interconnection pattern 17a are 180° different from each other in the direction in which the current flows, and the first interconnection pattern 11a and the second interconnection pattern 17a are disposed closely in positions such that the magnetic fields created by both interconnection patterns 11a and 17a cancel each other.

Further, the first interconnection pattern 11a and the second interconnection pattern 17a form a single interconnection line via the through holes 23b, so that the same current flows through the first interconnection pattern 11a and the second interconnection pattern 17a. Accordingly, it is possible to cancel magnetic fields with efficiency.

Figure 4A:
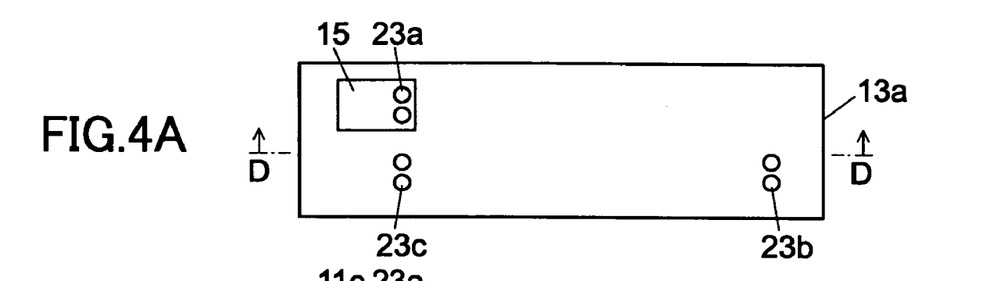
FIG. 4A is a plan view showing a first-layer interconnection pattern layer.
Figure 4B:
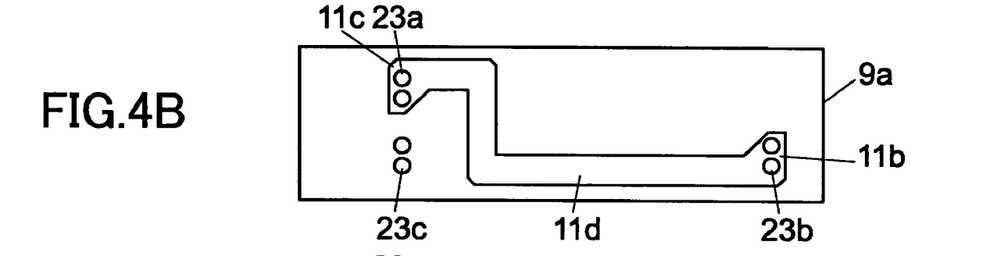
FIG. 4B is a plan view showing a second-layer interconnection pattern layer viewed from the upper surface side.
Figure 4C:
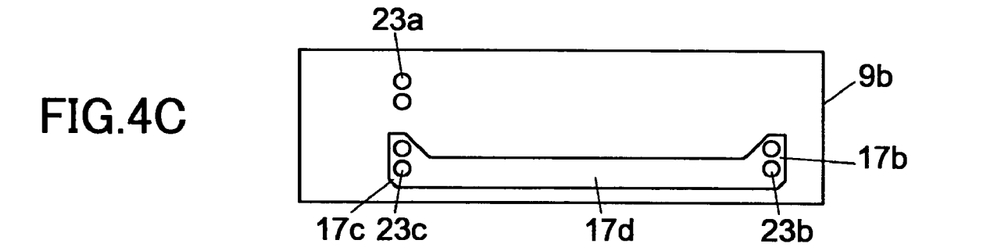
FIG. 4C is a plan view showing a third-layer interconnection pattern layer viewed from the upper surface side.
Figure 4D:
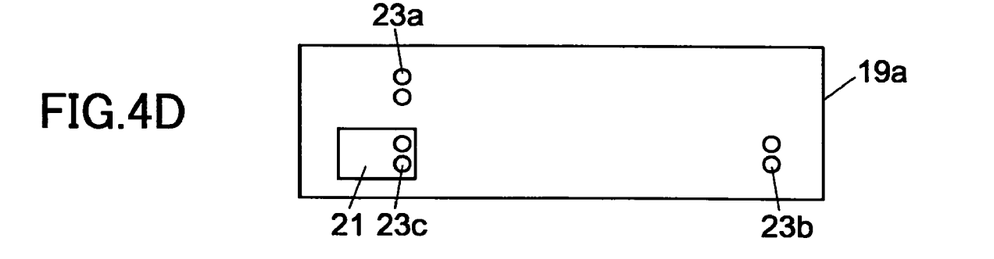
FIG. 4D is a plan view showing a fourth-layer interconnection pattern layer viewed from the upper surface side.
Figure 4E:
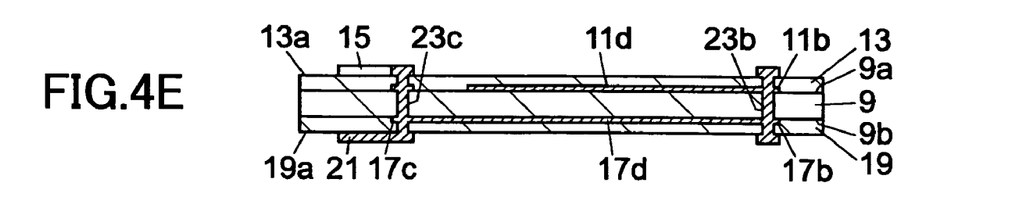
FIG. 4E is a cross-sectional view at the D—D position of FIG. 4A.

FIGS. 4A through 4E are diagrams showing still another embodiment of the second mode. FIG. 4A is a plan view showing a first-layer interconnection pattern layer, FIG. 4B is a plan view showing a second-layer interconnection pattern layer viewed from the upper surface side, FIG. 4C is a plan view showing a third-layer interconnection pattern layer viewed from the upper surface side, FIG. 4D is a plan view showing a fourth-layer interconnection pattern layer viewed from the upper surface side, and FIG. 4E is a cross-sectional view at the D—D position of FIG. 4A. The same parts as those of FIGS. 3A through 3E are assigned the same numerals, and a description thereof is omitted.

In the embodiment shown in FIGS. 3A through 3E, the first interconnection pattern 11a and the second interconnection pattern 17a are formed meanderingly. Alternatively, for instance, a first interconnection pattern 11d and a second interconnection pattern 17d may be rectilinear as shown in FIGS. 4A through 4E. The first interconnection pattern 11d and the second interconnection pattern 17d are formed so that their rectilinear parts are superposed when viewed from the upper surface side.

Also in this embodiment, for instance, when current flows from the electrode 15 to the electrode 21 via the through holes 23a, the first interconnection pattern 11d, the through holes 23b, the second interconnection pattern 17d, and the through holes 23c, it is possible to cancel magnetic fields in the first interconnection pattern 11d and the second interconnection pattern 17d as in the embodiment shown in FIGS. 3A through 3E.

Further, the first interconnection pattern 11d and the second interconnection pattern 17d form a single interconnection line via the through holes 23b, so that the same current flows through the first interconnection pattern 11d and the second interconnection pattern 17d. Accordingly, it is possible to cancel magnetic fields with efficiency.

In both embodiments described with reference to FIGS. 3A through 4E, the first interconnection pattern and the second interconnection pattern are formed by middle-layer interconnection pattern layers (a second layer and a third layer), exclusive of the uppermost layer (a first layer) and the lowermost layer (a fourth layer), in a printed wiring board having a four-layer structure. However, the present invention is not limited to this, and for instance, the first interconnection pattern and the second interconnection pattern may be formed in the first layer and the second layer.

Further, the first interconnection pattern and the second interconnection pattern do not always have to be formed in two vertically adjacent layers. For instance, the first interconnection pattern may be formed in the first layer, and the second interconnection pattern may be formed in the third layer.

Further, in the embodiments described with reference to FIGS. 1A through 4E, the first interconnection pattern and the second interconnection pattern have a meandering shape or are rectilinear. However, the second mode of the present invention is not limited to this. The first interconnection pattern and the second interconnection pattern may be curved lines.

Figure 5:
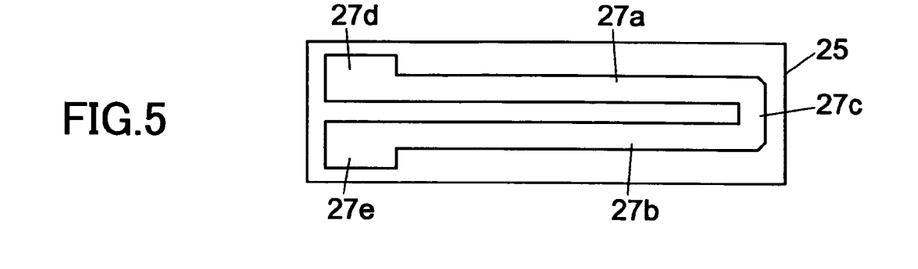
FIG. 5 is a plan view showing an embodiment of the first mode.

FIG. 5 is a plan view showing an embodiment of the first mode.

For instance, a first interconnection pattern 27a, a second interconnection pattern 27b, a bent-back part 27c, an electrode 27d, and an electrode 27e of copper of approximately 0.035 mm in film thickness are formed on a surface of an insulating substrate 25 of epoxy resin of approximately 0.2 mm in film thickness.

The first interconnection pattern 27a and the second interconnection pattern 27b are disposed closely in parallel. An end part of the first interconnection pattern 27a is connected to the electrode 27d, and the other end part thereof is connected to the bent-back part 27c. An end part of the bent-back part 27c on the opposite side from the first interconnection pattern 27a is connected to an end part of the second interconnection pattern 27b. The other end part of the second interconnection pattern 27b is connected to the electrode 27e.

The line width of the first interconnection pattern 27a and the second interconnection pattern 27b is, for instance, 0.8 mm, and the interval between the first interconnection pattern 27a and the second interconnection pattern 27b is, for instance, 0.2 mm.

For instance, when current flows from the electrode 27d to the electrode 27e via the first interconnection pattern 27a, the bent-back part 27c, and the second interconnection pattern 27b, it is possible to cancel magnetic fields in the first interconnection pattern 27a and the second interconnection pattern 27b since the first interconnection pattern 27a and the second interconnection pattern 27b are 180° different from each other in the direction in which the current flows, and the first interconnection pattern 27a and the second interconnection pattern 27b are disposed closely in positions such that the magnetic fields created by both interconnection patterns 27a and 27b cancel each other.

Further, the first interconnection pattern 27a and the second interconnection pattern 27b form a single interconnection line through the bent-back part 27c, so that the same current flows through the first interconnection pattern 27a and the second interconnection pattern 27b. Accordingly, it is possible to cancel magnetic fields with efficiency.

Figure 6A:
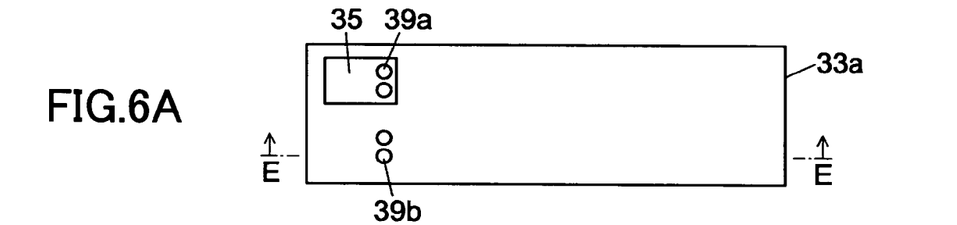
FIG. 6A is a plan view showing a first-layer interconnection pattern layer.
Figure 6B:
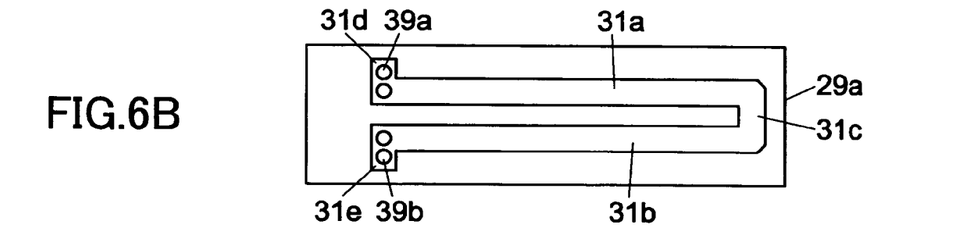
FIG. 6B is a plan view showing a second-layer interconnection pattern layer viewed from the upper surface side.
Figure 6C:
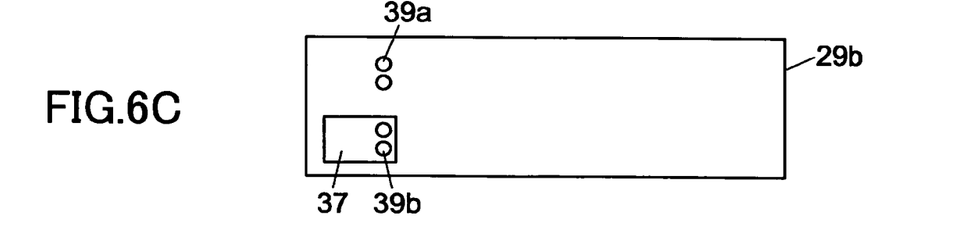
FIG. 6C is a plan view showing a third-layer interconnection pattern layer viewed from the upper surface side.
Figure 6D:
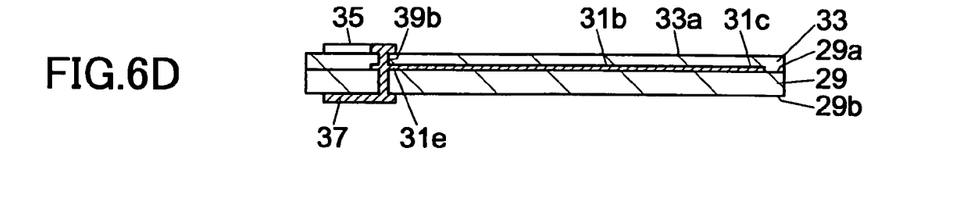
FIG. 6D is a cross-sectional view at the E—E position of FIG. 6A

FIGS. 6A through 6D are diagrams showing another embodiment of the first mode. FIG. 6A is a plan view showing a first-layer interconnection pattern layer, FIG. 6B is a plan view showing a second-layer interconnection pattern layer viewed from the upper surface side, FIG. 6C is a plan view showing a third-layer interconnection pattern layer viewed from the upper surface side, and FIG. 6D is a cross-sectional view at the E—E position of FIG. 6A.

For instance, a first interconnection pattern 31a, a second interconnection pattern 31b, and a bent-back part 31c of copper of approximately 0.018 mm in film thickness are formed on a surface 29a of an insulating substrate 29 of epoxy resin of approximately 0.2 mm in film thickness.

The first interconnection pattern 31a and the second interconnection pattern 31b are disposed closely in parallel. An end part of the first interconnection pattern 31a on the opposite side from an end part 31d thereof is connected to the bent-back part 31c. An end part of the bent-back part 31c on the opposite side from the first interconnection pattern 31a is connected to an end part of the second interconnection pattern 31b. The other end part of the second interconnection pattern 31b is indicated by numeral 31e.

The line width of the first interconnection pattern 31a and the second interconnection pattern 31b is, for instance, 0.8 mm, and the interval between the first interconnection pattern 31a and the second interconnection pattern 31b is, for instance, 0.2 mm.

For instance, an insulating material 33 of epoxy resin of approximately 0.1 mm in film thickness is applied on the surface 29a of the insulating substrate 29 through an adhesive agent (of which graphical representation is omitted).

For instance, an electrode 35 of copper of approximately 0.035 mm in film thickness corresponding to the end part 31d of the first interconnection pattern 31a is formed on a surface 33a of the insulating material 33.

For instance, an electrode 37 of copper of approximately 0.035 mm in film thickness corresponding to the end part 31e of the second interconnection pattern 31b is formed on a bottom surface 29b of the insulating substrate 29.

The end part 31d of the first interconnection pattern 31a and the electrode 35 are electrically connected via through holes 39a. The end part 31e of the second interconnection pattern 31b and the electrode 37 are electrically connected via through holes 39b. The through holes 39a and 39b are formed through the insulating material 33 and the insulating substrate 29.

The through holes 39a and 39b are formed by copper plating. The electrodes 35 and 37 are plated with copper at the time of forming the through holes 39a and 39b. The first interconnection pattern 31a and the second interconnection pattern 31b are covered with the insulating substrate 29 and the insulating material 33 at the time of copper plating. Accordingly, no plating is provided on the first interconnection pattern 31a and the second interconnection pattern 31b.

For instance, when current flows from the electrode 35 to the electrode 37 via the through holes 39a, the first interconnection pattern 31a, the bent-back part 31c, the second interconnection pattern 31b, and the through holes 39b, it is possible to cancel magnetic fields in the first interconnection pattern 31a and the second interconnection pattern 31b since the first interconnection pattern 31a and the second interconnection pattern 31b are 180° different from each other in the direction in which the current flows, and the first interconnection pattern 31a and the second interconnection pattern 31b are disposed closely in positions such that the magnetic fields created by both interconnection patterns 31a and 31b cancel each other.

Further, the first interconnection pattern 31a and the second interconnection pattern 31b form a single interconnection line via the bent-back part 31c, so that the same current flows through the first interconnection pattern 31a and the second interconnection pattern 31b. Accordingly, it is possible to cancel magnetic fields with efficiency.

In both embodiments described with reference to FIGS. 5A through 6D, the first interconnection pattern and the second interconnection pattern are rectilinear. However, the first mode of the present invention is not limited to this. The first interconnection pattern and the second interconnection pattern may be bent or curved lines.

The embodiments of the first mode and the second mode have been described with reference to FIGS. 1A through 6D. The first interconnection pattern and the second interconnection pattern forming the present invention may be used as resistors. In particular, as in the embodiments shown in FIGS. 3A through 3E, 4A through 4E and 6A through 6D, in a printed circuit board having multiple interconnection pattern layers, the first interconnection pattern and the second interconnection pattern may be sandwiched between insulating materials so that there may be no metal plating provided on the first interconnection pattern and the second interconnection pattern. This makes it possible to stabilize the film thickness of the first interconnection pattern and the second interconnection pattern, thus making it possible to stabilize resistance.

A description is given above of embodiments of the present invention, but the present invention is not limited to these. Shapes, materials, and dispositions are examples, and variations may be made within the scope of the present invention recited in SCOPE OF PATENT CLAIMS.

BRIEF DESCRIPTION OF THE DRAWINGS

FIGS. 1A through 1C are diagrams showing an embodiment of the second mode, where FIG. 1A is a plan view showing the interconnection pattern layer of a bottom surface viewed from the upper surface side, and FIG. 1A is a cross-sectional view at the A—A position of FIG. 1A.

FIGS. 2A through 2C are diagrams showing another embodiment of the second mode, where

FIGS. 3A through 3E are diagrams showing yet another embodiment of the second mode, where

FIGS. 4A through 4E are diagrams showing still another embodiment of the second mode, where

FIGS. 6A through 6D are diagrams showing another embodiment of the first mode, where

DESCRIPTION OF THE REFERENCE NUMERALS 1,9,25,29 Insulating substrates
1a, 9a, 29a Surfaces of the insulating substrates
1b, 9b, 29b Bottom surfaces of the insulating substrates
3a, 3e 5e, 11a, 11d, 27a, 31a First interconnection patterns
3b, 3c, 15, 21, 27d, 27e, 31d, 31e, 35, 37 Electrodes
3d, 11b, 11c, 31d End parts of the first interconnection patterns
5a, 5d, 17a, 17d, 27b, 31b Second interconnection patterns
5b, 5c, 17b, 17c, 31e End parts of the second interconnection patterns
7a, 7b, 23a, 23b, 23c, 39a, 39b Through holes
13, 19, 33 Insulating materials
13a, 19a, 33a Surfaces of the insulating materials
27c, 31c Bent-back parts

The invention claimed is:

1. A printed wiring board, comprising:
   a first interconnection pattern and a second interconnection pattern, wherein a first portion of said first interconnection pattern is superposed over a second portion of said second interconnection pattern for substantial portions of said first and second interconnection patterns,
   a current flowing through said first portion in a first direction 180° different from a second direction in which current flows through said second portion, and
   wherein the first interconnection pattern and the second interconnection pattern are formed on a same plane surface, and
   wherein the first interconnection pattern and the second interconnection pattern are disposed closely in positions such that magnetic fields created thereby cancel each other.

2. The printed wiring board as claimed in claim 1, wherein the first interconnection pattern and the second interconnection pattern are formed by bending back a single interconnection line.

3. The printed wiring board as claimed in claim 1, wherein the first interconnection pattern and the second interconnection pattern function as resistors.

4. The printed wiring board as claimed in claim 1, wherein the first interconnection pattern and the second interconnection pattern are sandwiched between insulating materials so that no metal plating is provided on the first interconnection pattern and the second interconnection pattern.

5. A printed wire board, comprising:
   a first interconnection pattern on a first plane and a second interconnection pattern on a second plane, said second plane being parallel to said first plane,
   wherein the first interconnection pattern and the second interconnection pattern are superposed one over the other for substantial portions of said first and second interconnection patterns,
   for said substantial superposed portions, a first direction of current flow through the first connection pattern is 180° different from a second direction of current flow through the second interconnection pattern, and
   the first interconnection and the second interconnection pattern are disposed closely in positions such that magnetic fields created thereby cancel each other.

6. The printed wiring board as claimed in claim 5, wherein the first and second interconnection patterns function as resistors.

7. The printed wiring board as claimed in claim 5, wherein the first and second interconnection patterns are sandwiched between insulating materials so that no metal plating is provided on the first interconnection pattern and the second interconnection pattern.

8. The printed wiring board as claimed in claim 5, wherein the first interconnection pattern and the second interconnection pattern are formed by bending back a single interconnection line via a through hole.

9. A printed wiring board comprising:
   a first interconnection pattern and a second interconnection pattern, said first interconnection including a first portion that is straight, said second interconnection portion including a second portion that is straight, wherein one of said first and second straight portions is superposed over the other,
   a first direction of current flow through one of said superposed portions is 180° different from a second direction of current flow through the other of said superposed portions, said first and second portions are substantial portions of said first and second interconnection patterns, said first straight portion is on a first plane and said second straight portion is on a second plane, said second plane being parallel to said first plane, and the first interconnection pattern and the second interconnection pattern are disposed closely in positions, such that magnetic fields are created thereby cancel each other.

10. The printed wiring board as claimed in claim 9, wherein the first and second interconnection patterns function as resistors.

11. The printed wiring board as claimed in claim 9, wherein the first and second interconnection patterns are sandwiched between insulating materials so that no metal plating is provided on the first interconnection pattern and the second interconnection pattern.

12. The printed wiring board as claimed in claim 9, wherein the first interconnection pattern and the second interconnection pattern are formed by bending back a single interconnection line via a through hole.

* * * * *